United States Patent
Li

(10) Patent No.: US 9,665,199 B2
(45) Date of Patent: May 30, 2017

(54) TOUCH BUTTON

(71) Applicant: SHENZHEN NEW DEGREE TECHNOLOGY CO., LTD., Shenzhen, Guangdong (CN)

(72) Inventor: Hao Li, Chandlier, AZ (US)

(73) Assignee: Shenzhen New Degree Technology Co., Ltd., Shenzhen, Guangdong (CN)

( * ) Notice: Subject to any disclaimer, the term of this patent is extended or adjusted under 35 U.S.C. 154(b) by 0 days.

(21) Appl. No.: 14/652,022

(22) PCT Filed: Feb. 8, 2013

(86) PCT No.: PCT/CN2013/071566
§ 371 (c)(1),
(2) Date: Jun. 12, 2015

(87) PCT Pub. No.: WO2014/121516
PCT Pub. Date: Aug. 14, 2014

(65) Prior Publication Data
US 2015/0324051 A1 Nov. 12, 2015

(51) Int. Cl.
*G06F 3/041* (2006.01)
*G06F 3/047* (2006.01)

(52) U.S. Cl.
CPC ............ *G06F 3/0414* (2013.01); *G06F 3/041* (2013.01); *G06F 3/047* (2013.01)

(58) Field of Classification Search
CPC ......... G06F 3/0414; G06F 3/041; G06F 3/047
USPC ....................................................... 345/156
See application file for complete search history.

(56) References Cited

U.S. PATENT DOCUMENTS

| | | | |
|---|---|---|---|
| 2004/0255682 A1* | 12/2004 | Petrova | G01L 9/0055 73/715 |
| 2011/0037726 A1 | 2/2011 | Lee | |
| 2012/0162087 A1 | 6/2012 | Hou | |
| 2013/0154998 A1* | 6/2013 | Yang | H03K 17/9625 345/174 |

FOREIGN PATENT DOCUMENTS

| | | |
|---|---|---|
| CN | 102016780 | 4/2011 |
| JP | 2011-086191 | 4/2011 |
| JP | 2011086191 A * | 4/2011 |

OTHER PUBLICATIONS

International Search Report for PCT/CN2013/071566, dated Nov. 14, 2013, 4 pages total (English language translation provided).

* cited by examiner

*Primary Examiner* — Kent Chang
*Assistant Examiner* — Mark Edwards
(74) *Attorney, Agent, or Firm* — Nixon & Vanderhye P.C.

(57) ABSTRACT

The present invention relates to technical field of electronic switch control and discloses a touch button, which comprises a panel and a hollow pad module; wherein, the panel is provided with a button area, and the pad module is arranged at an edge of the button area of the panel; the touch button further comprises at least one sensor configured to sense a pressure, and the sensor is arranged inside the pad module and abuts against the panel. By providing such a touch button, the panel of the touch button can be made of any material, and thus the application range of the touch button is enlarged. Moreover, the touch button has good durability, is beautiful, can identify touch pressures accurately, has high sensitivity, and brings convenience into the actual use.

20 Claims, 2 Drawing Sheets

TOUCH BUTTON

FIELD OF THE INVENTION

The present invention relates to the technical field of electronic switch control, and more particularly to a touch button.

BACKGROUND OF THE INVENTION

Touch buttons are widely used in various industries, such as household appliances, handheld devices, remote control devices, industrial control, and so on. At present, touch buttons mainly include two categories: membrane switch and capacitive buttons.

A membrane switch can only use a soft plastic surface, which has limitation, is not beautiful, and has low durability; furthermore, the plastic surface is prone to be damaged. A capacitive button is easy to be interfered, and cannot be operated in the case that there is water or the user wears a glove. The two categories of touch buttons cannot use metal panels, and cannot measure pressures applied on the touch buttons.

SUMMARY OF THE INVENTION

The purpose of the present invention is to overcome the defects of the above-described prior art. Accordingly, the present invention should provide a touch button, of which the panel can be made of any material, and the touch button should have good durability, be beautiful, resist environmental interferences, and have good performance of identifying touch pressures.

The present invention is realized by the following technical solution: a touch button, which comprises a panel and a hollow pad module; wherein, the panel is provided with a button area, and the pad module is arranged at an edge of the button area of the panel; the touch button further comprises at least one sensor configured to sense pressures, and the sensor is arranged inside the pad module and abuts against the panel.

Preferably, the touch button comprises at least two sensors, and the at least two sensors are respectively attached to different locations of the panel.

Preferably, the location of the pad module relative to the sensors makes the measurement value of at least one of the sensors be negative, and also makes the measurement value of at least one of the sensors be positive.

Preferably, the sensor is a strain sensor.

Preferably, the strain sensor is made of thin metal wires, polycrystalline or amorphous semiconductors, carbon nanotubes, or conductive composites.

Preferably, the pad module and the panel are made of the same piece of material and integrated with each other.

Preferably, the touch button further comprises a circuit module, and two ends of the sensor are electrically connected with the circuit module through wires.

Preferably, the wires includes a first wire which is electrically connected with two ends of the sensor and at a first electric potential, a second wire which is electrically connected with a central location of the sensor and at a second electric potential, and a third wire which is connected between each of the two ends of the sensor and the central location of the sensor.

In the touch button of the present invention, the hollow pad module supports the edge of the panel, at least one sensor configured to sense a pressure is arranged inside the hollow pad module, and the sensor abuts against the panel. By adopting such a touch button system, the limitation of the panel material of conventional touch buttons is overcome. The panel of this touch button can be made of any material, has good durability, is beautiful, can identify touch pressures accurately, has high sensitivity, and brings convenience into the actual use.

DETAILED DESCRIPTION OF THE PREFERRED EMBODIMENT

In order to make the objectives, technical solutions, and advantages of the present invention be clearer, the present invention will be further described hereafter with reference to the accompany drawings and embodiments. It should be understood that the embodiments described herein are only intended to illustrate but not to limit the present invention.

Figure 1:
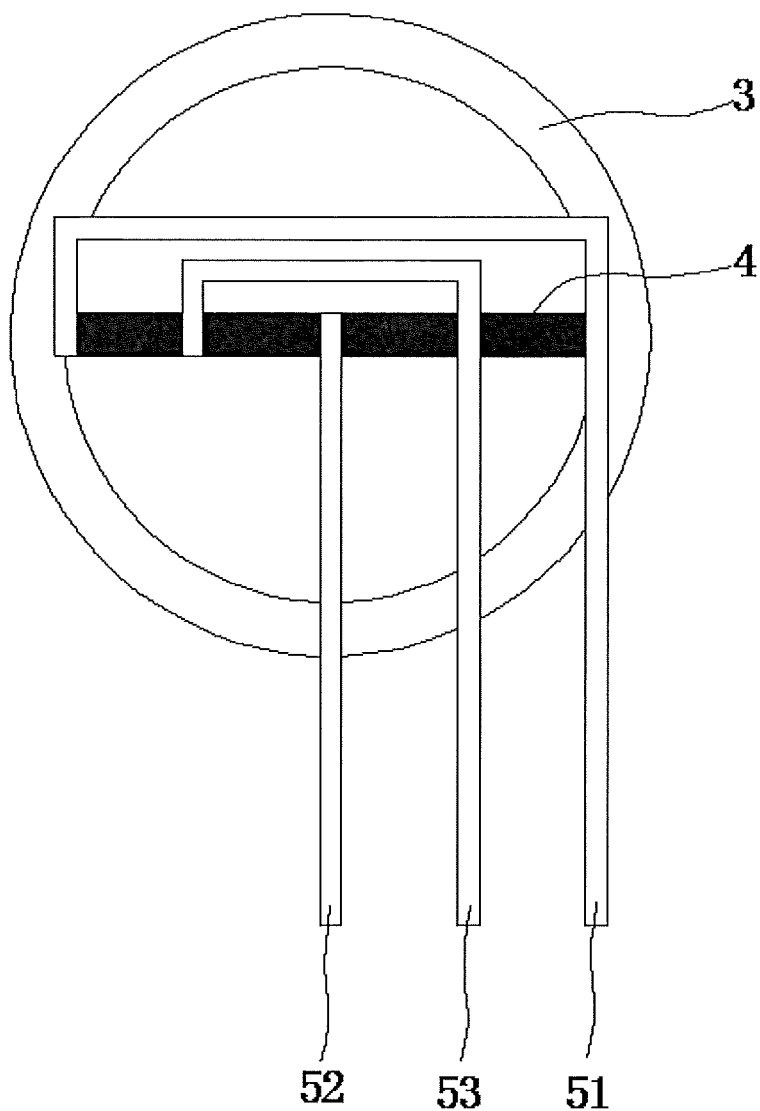
FIG. 1 is a top view of a touch button provided by an embodiment of the present invention, wherein a panel of the touch button is removed.
Figure 2:
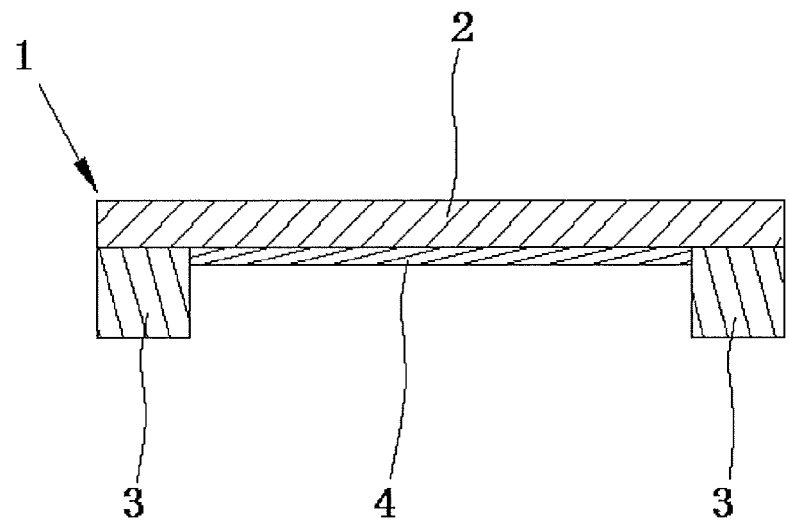
FIG. 2 is a cut-away view of the touch button provided by the embodiment of the present invention.

As shown in FIG. 1 and FIG. 2, the present invention provides a touch button 1, which comprises a panel 2 and a hollow pad module 3; the panel 2 is provided with a button area (not shown), and the pad module 3 is arranged at the edge of the button area of the panel 2. By this arrangement, the pad module 3 can support the panel 2, and can also enable the panel 2 to have certain deformation space when the panel 2 is pressed. In the actual use, the periphery of each touch button 1 of a device is supported by a pad module 3, which ensures the reliability of using the touch button 1. The pad module 3 can be independent from the panel 2, and made of material differing from that of the panel 2; however, the pad module 3 can also be made of the same material as that of the panel 2, and the panel 2 and the pad module 3 can be made of the same piece of material and thereby integrated with each other. The touch button 1 further includes at least one sensor 4 configured to sense pressures applied on the touch button 1, the sensor 4 is arranged inside the pad module 3 and abuts against the panel 2. The panel 2 has a certain elastic modulus, when being pressed, the panel 2 can generate a certain elastic deformation; the sensor 4 abutting against the panel 2 can sense the pressure applied on the panel 2 accurately, and thereby realize the corresponding control function. Of course, understandably, the sensor 4 can be arranged at a surface of the panel 2 by the method of direct deposition, such as screen printing, pad printing, coating, and so on; the sensor 4 can also be arranged at plastic film, for example, PET (polyethylene terephthalate) film or PI (polyimide) film, in advance, and then glued onto the panel 2. By adopting such a touch button system, the limitation of the panel material of conventional touch buttons is overcome. The panel 2 of this touch button 1 can be made of any material, such as plastics, glass, metal, and so on. The panel 2 has good durability, is waterproof, can resist environmental interferences, is beautiful, can accurately identify pressures applied thereon, has high sensitivity, and brings convenience into the actual use. Thus, the application range of the touch button 1 is enlarged.

In particular, the touch button 1 includes at least two sensors 4, and the at least two sensors 4 are respectively attached to different locations of the panel 2. When a pressure is applied to the panel 2, the panel 2 generates positive and negative strain changes; the two or more adjacent sensors 4 detect the strain changes, so that different resistance changes are obtained; by a differential (subtraction) algorithm, the effect on the detecting results of the sensors 4, which is caused by varying factors in the environment, such as a temperature or a stress, can be reduced to the minimum, and thus the precision and reliability of the detection values can be ensured. By adopting the touch button 1 including at least two sensors 4, the pressed locations and the pressure values can be identified more accurately, and different resistance changes can be obtained, so that corresponding operation and control functions can be further realized, and the accuracy and reliability of using the touch button 1 can be ensured. Of course, understandably, the touch button 1 can include a plurality of sensors 4, which are mounted at different locations of the panel 2; in this way, more precise resistance changes can be detected, the environmental effect on the detected values can be reduced to the minimum, the best detecting result can be achieved, and the requirement for the operation accuracy can be met.

In particular, as shown in FIG. 1 and FIG. 2, the pad module 3 supports the edge of the panel 2; when the panel 2 is pressed, the central portion of the panel 2 generates a positive deformation, and the peripheral portion of the panel 2 generates a negative deformation. Therefore, as long as the sensors 4 are positioned at proper locations, for example, one sensor 4 is positioned at the central portion and another sensor 4 is positioned at the peripheral portion, in response to a pressure applied on the panel 2, the sensor 4 at the central portion generates a positive change, and the sensor 4 at the peripheral portion generates a negative change. If detecting wires are extended from proper sensors 4, the positive and negative changes can achieve the same proportion, and can entirely offset the environmental effect. Of course, understandably, it is unnecessary that one sensor 4 is positive and another sensor 4 is negative. As long as there is a large enough difference between the strains detected by the two sensors 4, the effect of the external environment can be reduced or eliminated by the differential (subtraction) method. In this way, the effect caused by the environment can be reduced to the minimum, and thus the accuracy of operating the touch button 1 is improved.

In particular, as shown in FIG. 1 and FIG. 2, the pad module 3 is round, rectangular, or oval. The pad module 3 is hollow, which meets the requirement for the assembly locations of the sensors 4. The pad module 3 can be round, rectangular, or oval. Of course, understandably, on the premise that the requirement for the assembly locations of the sensors 4 is met, the shape of the hollow pad module 3 can also be other shapes, such as various polygons. In this way, the same button area can have different strain values. The larger the differences between these strain values, the more sensitive the reaction of the touch button 1.

Figure 3:
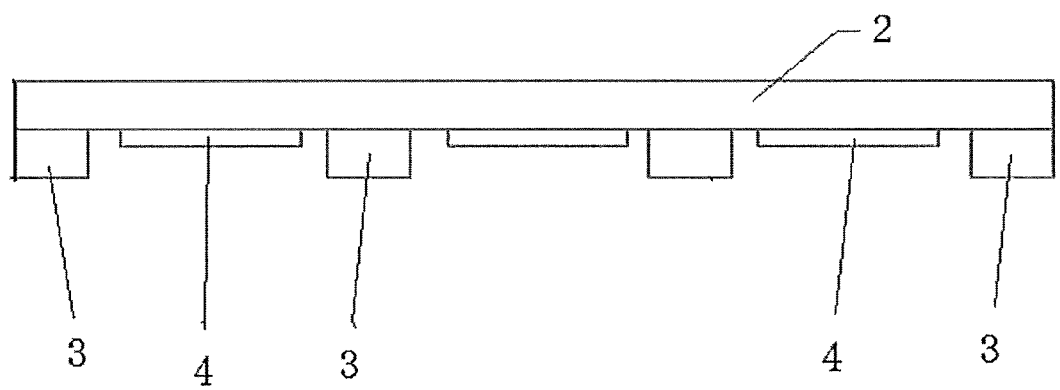
FIG. 3 is a schematic view of an assembled state of the touch button provided by the embodiment of the present invention.

In particular, as shown in FIG. 3, in the actual use, a plurality of touch buttons 1 can be used in combination, so that the requirements for using the touch buttons 1 in different situations can be met.

In particular, the sensor 4 is a strain sensor. The sensor 4 can be any type of strain sensor, such as thin metal wires, polycrystalline or amorphous semiconductors, carbon nanotubes, conductor-insulator composites, and so on. Preferably, the strain sensor is a kind of composite conductor, which comprises conductive particles and an insulating polymer substrate. The insulating substrate can be polyester, epoxy resin, phenoxy resin, silicone, and so on. The conductive particles can be metal powder, such as Ni or Ag, and can also be carbon powder or conductive nano-tubes. Furthermore, the conductive particles can also be oxide powder, such as indium tin oxide (ITO), zinc oxide (ZnO), ruthenium oxide ($RuO_2$), and so on. The sizes of the conductive particles are in the range from about 10 nanometers to 10 microns, and the conductive particles are uniformly dispersed in the substrate. When the concentration of the conductive particles reaches a percolation threshold, a small horizontal strain can cause the resistance of the sensor 4 to change; by measuring a resistance between two electrodes, a value of a pressure applied on the panel 2 can be derived. The resistance changes can be measured by a voltage detecting circuit, a constant current source circuit, or a bridge circuit. Moreover, by controlling the content of the conductive particles, the conductive performance of the sensor 4 can be controlled within a certain range, so that the measuring circuit can easily measure small resistance changes.

Additionally, the touch button 1 further includes a circuit module (not shown), and two ends of the sensor 4 are electrically connected with the circuit module through wires. When the sensor 4 detects a pressure applied thereon, it generates an electrical signal, and the electrical signal is transmitted to the circuit module through the wires. The circuit module processes the electrical signal correspondingly, so that corresponding key-values and pressure values are obtained, and corresponding control and operation functions are realized.

In particular, as shown in FIG. 1 and FIG. 2, the wires includes a first wire 51 which is electrically connected with two ends of the sensor 4 and at a first electric potential, a second wire 52 which is electrically connected with a central location of the sensor 4 and at a second electric potential, and a third wire 53 which is connected between each of the two ends of the sensor 4 and the central location of the sensor 4. By arranging the three wires 51, 52, and 53, the sensor 4 can be supplied with electric power, and voltage values and resistance values detected by the sensor 4 can be sent out. Through such a design, when an environmental factor, for example, a temperature or a stress, is applied on or near the sensor 4, the temperature or the stress can generate effects in the same direction on both the positive changing portion and the negative changing portion of the sensor 4. In actual calculations, by calculating the voltage values and the resistance values detected by the sensor 4, the effect caused by the environmental factors, such as the temperature or the stress, can be reduced to the minimum, and thus the phenomenon that the accuracy of the detecting results is adversely affected will not occur. It is ensured that when the sensor 4 is subjected to a pressure, the sensor 4 can sensitively and accurately detect and identify information, such as the value and the location of the pressure applied thereon, and thus the accuracy of the actual operation of the touch button 1 is improved.

In the touch button 1 provided by the present invention, the principle of reducing the environmental effect is detailed as follows.

When the measuring circuit is powered on, and the panel 2 is not pressed:

$$Vm0 = \frac{R_{V_m V_{ss}}}{R_{V_{cc} - V_{ss}}} * (Vcc - Vss)$$

wherein, $R_{V_m - V_{ss}} = R_{V_{cc} - V_m} = (R_{V_{cc} - V_{ss}})/2$;

therefore, Vm0=(Vcc-Vss)/2.

When a pressure is applied on the panel 2:

$$Vm1 = \frac{R_{Vm-Vss} + \Delta R_p}{R_{Vm-Vss} + \Delta R_p + R_{Vcc-Vm} - \Delta R_p} *(Vcc - Vss);$$

$$\Delta Vm' = Vm1 - Vm0 = \frac{\Delta R_p}{R_{Vcc-GND}} *(Vcc - Vss)$$

When environmental factors (e.g., a temperature or a stress) change:

$$Vm2 = \frac{R_{Vm-Vss} + \Delta R_T}{R_{Vm-Vss} + \Delta R_T + R_{Vcc-Vm} - \Delta R_T} *(Vcc - Vss);$$

$$Vm2 = \frac{1}{2}(Vcc - Vss)$$

$$\Delta Vm' = Vm2 - Vm0 = 0$$

therefore, at this time, the environment does not affect the measurement.

In the aforementioned formulae:

Vcc is the voltage value of an end of the first wire 51;

Vss is the voltage value of an end of the second wire 52;

Vm is the voltage value of an end of the third wire 53;

$R_{Vm\text{-}Vss}$ is a resistance of Vm relative to Vss;

$R_{Vcc\text{-}GND}$ is a resistance of Vcc relative to GND (i.e., the ground), that is, $R_{Vcc\text{-}GND}$ is the resistance of the whole sensor 4;

$R_{Vcc\text{-}Vm}$ is a resistance of Vcc relative to Vm;

$\Delta R_p$ is a resistance part that changes in response to the pressure applied on the panel 2;

$\Delta R_T$ is a resistance part that is affected by the environment.

In the touch button 1 provided by the present invention, the pad module 3 configured to support the panel 2 is arranged at the edge of the panel 2; the pad module 3 is hollow, and the sensor 4 configured to sense pressures is arranged inside the pad module 3 and abuts against the panel 2, so that pressures applied on the panel 2 can be sensed accurately and timely. By designing such a touch button system, the panel 2 of the touch button 1 can be made of any material, has good durability, is beautiful, can identify pressures accurately, has high sensitivity, overcomes the limitation of the panel material of conventional touch buttons, enlarges the application range of the touch button 1, and brings convenience into the actual use. Moreover, by using at least two sensors 4, this kind of touch button 1 can detect more accurate resistance changes; by the differential (subtraction) calculation according to the detected resistance changes, the effect on the detecting results of the sensors 4, which may be caused by the temperature or the stress changing in the environment, can be eliminated or reduced to the minimum. Thus, it is ensured that the sensor 4 can accurately identify the operation pressure and the operated location, and the accuracy of the control and operation of the touch button 1 is improved.

What described above are only preferred embodiments of the present invention, and are not intended to limit the scope of the present invention; and any modifications, equivalent replacements, and improvements made within the spirit and principle of the present invention should be included in the protection scope of the present invention.

What is claimed is:

1. A touch button comprising:
a sheet;
at least one sensor arrangement comprising at least first and second serially connected sensor elements respectively attached to different locations of the sheet, the at least first and second serially connected sensor elements being exposed to different mechanical stresses when the sheet is pressed;
the at least first and second serially connected sensor elements being configured to respond to said different mechanical stresses when the sheet is pressed by producing a difference between a first electrical signal provided by the first serially connected sensor element and a second electrical signal provided by the second serially connected sensor element while reducing the impact of environmental temperature change on the produced difference; and
a circuit, wherein the first and second sensor elements are electrically connected with the circuit through wires, the wires including a first wire which is electrically connected with the first and second sensor elements and at a first electric potential, a second wire which is electrically connected with a central location of the sensor arrangement and at a second electric potential, and a third wire which is connected between each of the first and second sensor elements and the central location of the sensor arrangement.

2. The touch button according to claim 1, wherein the first sensor element generates a positive change to the first electrical signal and the second sensor element generates a negative change to the second electrical signal.

3. The touch button according to claim 1, wherein the first and second sensor elements each comprises train sensors.

4. The touch button according to claim 3, wherein the strain sensors comprise thin metal wires, polycrystalline or amorphous semiconductors, carbon nano-tubes, or conductive composites.

5. The touch button according to claim 1, further including a pad assembly made of the same piece of material as the sheet wherein the pad assembly and sheet are integrated with each other.

6. The touch button of claim 1, further comprising a hollow pad structure wherein the sheet comprises a panel provided with a button area, and the pad structure is arranged at an edge of the button area of the panel.

7. The touch button of claim 1, wherein the first and second sensor elements comprise resistive elements.

8. The touch button of claim 1, wherein the first sensor element is disposed near a center of the sheet and the second sensor is disposed near a periphery of the sheet.

9. The touch button of claim 1, wherein the sheet defines a button area.

10. The touch button of claim 9, wherein the button area comprises a circle.

11. The touch button of claim 1, wherein the circuit comprises a bridge circuit.

12. The touch button of claim 1, wherein the sensor arrangement comprises first, second, third and fourth series-connected sensor elements.

13. The touch button of claim 1, wherein the circuit processes the difference to obtain pressure values.

14. The touch button of claim 13, wherein the circuit realizes control and operation functions corresponding to the pressure values.

15. The touch button of claim 1, wherein the sensor arrangement detects the value of applied pressure.

16. The touch button of claim 15, wherein the sensor arrangement further detects the location of pressure applied to the sheet.

17. The touch button of claim 1, wherein the sensor arrangement detects the location of pressure applied to the sheet.

18. The touch button of claim 1, wherein in response to pressure applied to the sheet, the first sensor element at a first position on the sheet generates a signal change in a first direction, and the second sensor element at a second position on the sheet generates a signal change in a second direction opposite the first direction.

19. The touch button of claim 1, wherein the sensor arrangement is disposed on a film glued to the sheet.

20. The touch button of claim 1, wherein the sensor arrangement comprises conductive particles and an insulating polymer substrate, and changes resistance when the concentration of conductive particles reaches a percolation threshold.

* * * * *